United States Patent
Matsunaga et al.

(10) Patent No.: US 12,363,455 B2
(45) Date of Patent: Jul. 15, 2025

(54) IMAGE SENSOR OPERATING IN A PHOTOVOLTAIC MODE

(71) Applicant: OmniVision Technologies, Inc., Santa Clara, CA (US)

(72) Inventors: Yoshiyuki Matsunaga, Kyoto (JP); Keiji Mabuchi, Cupertino, CA (US); Lindsay Grant, Campbell, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 111 days.

(21) Appl. No.: 18/393,069

(22) Filed: Dec. 21, 2023

(65) Prior Publication Data

US 2025/0211871 A1    Jun. 26, 2025

(51) Int. Cl.
*H04N 25/60* (2023.01)
*H04N 25/77* (2023.01)
*H04N 25/78* (2023.01)
*H04N 25/79* (2023.01)
*H10F 39/00* (2025.01)

(52) U.S. Cl.
CPC .......... *H04N 25/60* (2023.01); *H04N 25/77* (2023.01); *H04N 25/79* (2023.01); *H10F 39/809* (2025.01); *H04N 25/78* (2023.01)

(58) Field of Classification Search
CPC ........ H04N 25/60; H04N 25/77; H04N 25/78; H04N 25/79; H10F 39/809
See application file for complete search history.

(56) References Cited

U.S. PATENT DOCUMENTS

| | | | |
|---|---|---|---|
| 6,512,544 B1 * | 1/2003 | Merrill | H04N 25/59 |
| | | | 257/E27.128 |
| 9,338,381 B2 | 5/2016 | Kondo | |
| 10,757,350 B2 * | 8/2020 | Tashiro | H04N 25/65 |
| 11,196,947 B2 | 12/2021 | Ni | |
| 12,281,937 B1 * | 4/2025 | Matsunaga | G01J 1/44 |
| 2025/0106533 A1 * | 3/2025 | Matsunaga | H04N 25/771 |
| 2025/0159372 A1 * | 5/2025 | Matsunaga | H04N 25/65 |
| 2025/0159373 A1 * | 5/2025 | Matsunaga | H04N 25/65 |

OTHER PUBLICATIONS

Image Sensor to Supress Flicker; U.S. Appl. No. 18/507,301, filed Nov. 13, 2023; Yoshiyuki Matsunaga, et al.

* cited by examiner

*Primary Examiner* — Lin Ye
*Assistant Examiner* — Chriss S Yoder, III

(57) ABSTRACT

An image sensor includes a sensor substrate and a circuit substrate. The sensor substrate includes a plurality of sensor substrate-side pixels. Each of the sensor substrate-side pixels includes a photodiode configured to operate in a photovoltaic mode, a reset transistor configured to reset the photodiode, and a pixel source follower transistor connected to an output of the photodiode. The circuit substrate includes circuit substrate-side pixels corresponding to the respective sensor substrate-side pixels of the sensor substrate. Each of the circuit substrate-side pixels includes a peak hold circuit configured to hold a peak of an output of the pixel source follower transistor by receiving the output of the pixel source follower transistor, and a readout source follower transistor configured to read out a voltage held in a holding capacitor. The sensor substrate-side pixels and the respective corresponding circuit substrate-side pixels are connected to each other.

7 Claims, 9 Drawing Sheets

IMAGE SENSOR OPERATING IN A PHOTOVOLTAIC MODE

TECHNICAL FIELD

The present disclosure generally relates to an image sensor in which a pixel circuit is dividedly provided on a plurality of substrates.

BACKGROUND INFORMATION

An image sensor includes a plurality of pixels arranged in a matrix, and each of the pixels acquires a signal corresponding to an incident light amount.

Each of the pixels outputs the signal corresponding to the incident light amount during an integration period of one frame. As an electronic shutter defining a timing of the integration period, a rolling shutter or a global shutter is used.

In a case of the rolling shutter, a shutter on period (integration period) is sequentially shifted for each row (each line). In other words, the signals of the lines are sequentially output by shifting the shutter on period by one horizontal period. In contrast, in a case of the global shutter, the shutter on period is identical, the signals are temporarily held in the pixels and are then output line by line.

A problem with the rolling shutter is that, when a moving object is imaged, a reproduced image is distorted because the shutter on periods (integration periods) are different among the lines. An onboard camera preferably uses the global shutter.

To realize the global shutter, a holding capacitor accumulating and holding the signal for a predetermined period is necessary in the same pixel. However, when the holding capacitor is provided on a substrate provided with a photodiode, pseudo-sensitivity may occur because part of light entering the photodiode leaks to the holding capacitor. The pseudo-sensitivity is similar to the reproduced image of the rolling shutter. Therefore, in this case, the image of the global shutter and the image of the rolling shutter are viewed to be superimposed on each other.

To solve the problem, an example has disclosed a structure in which the holding capacitor is provided on a second substrate different from a first substrate provided with the photodiode to prevent leakage of the incident light from entering the holding capacitor. The above-described two substrates are electrically coupled by a pixel contact.

Noise reduction is required in any of the above-described image sensors.

SUMMARY

An image sensor according to the present disclosure includes a sensor substrate and a circuit substrate.

The sensor substrate includes a plurality of sensor substrate-side pixels. Each of the sensor substrate-side pixels includes a photodiode configured to operate in a photovoltaic mode, a reset transistor configured to reset the photodiode, and a pixel source follower transistor connected to an output of the photodiode.

The circuit substrate includes circuit substrate-side pixels corresponding to the respective sensor substrate-side pixels of the sensor substrate. Each of the circuit substrate-side pixels includes a peak hold circuit configured to hold a peak of an output of the pixel source follower transistor by receiving the output of the pixel source follower transistor, and a readout source follower transistor configured to read out a voltage held in a holding capacitor.

The peak hold circuit includes a peak hold transistor configured to allow a current corresponding to the output of the pixel source follower transistor to flow therethrough, a switch transistor configured to turn on/off an output of the peak hold transistor, and the holding capacitor configured to hold an output of the switch transistor.

The sensor substrate-side pixels and the respective corresponding circuit substrate-side pixels are connected to each other.

In the image sensor according to the present disclosure, the peak hold transistor is provided in the pixel circuit, which may make it possible to prevent occurrence of a flicker. In addition, the peak hold transistor is provided on the substrate different from the substrate provided with the photodiode, which may make it possible to reduce noise.

BRIEF DESCRIPTION OF THE DRAWINGS

Embodiment(s) of the present disclosure will be described based on the following figures, wherein.

DESCRIPTION OF EMBODIMENTS

An embodiment of the present disclosure is described below with reference to drawings. The following embodiment does not limit the present disclosure, and configurations obtained by selectively combining a plurality of illustrations are also included in the present disclosure.

Premise Configuration

Figure 1:
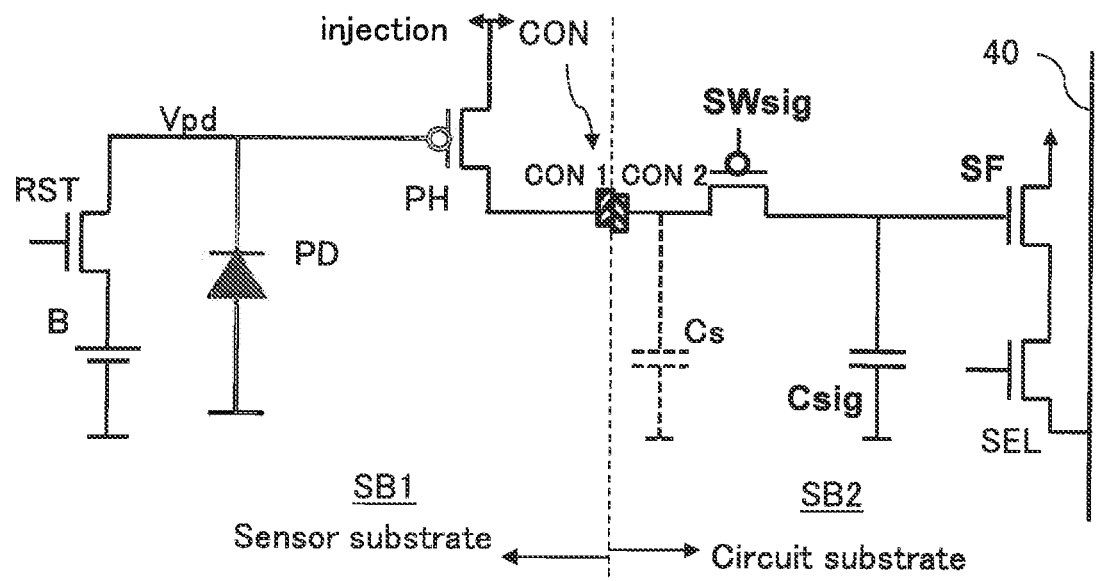
FIG. 1 is a diagram illustrating a circuit configuration as a premise of an embodiment.
Figure 2:
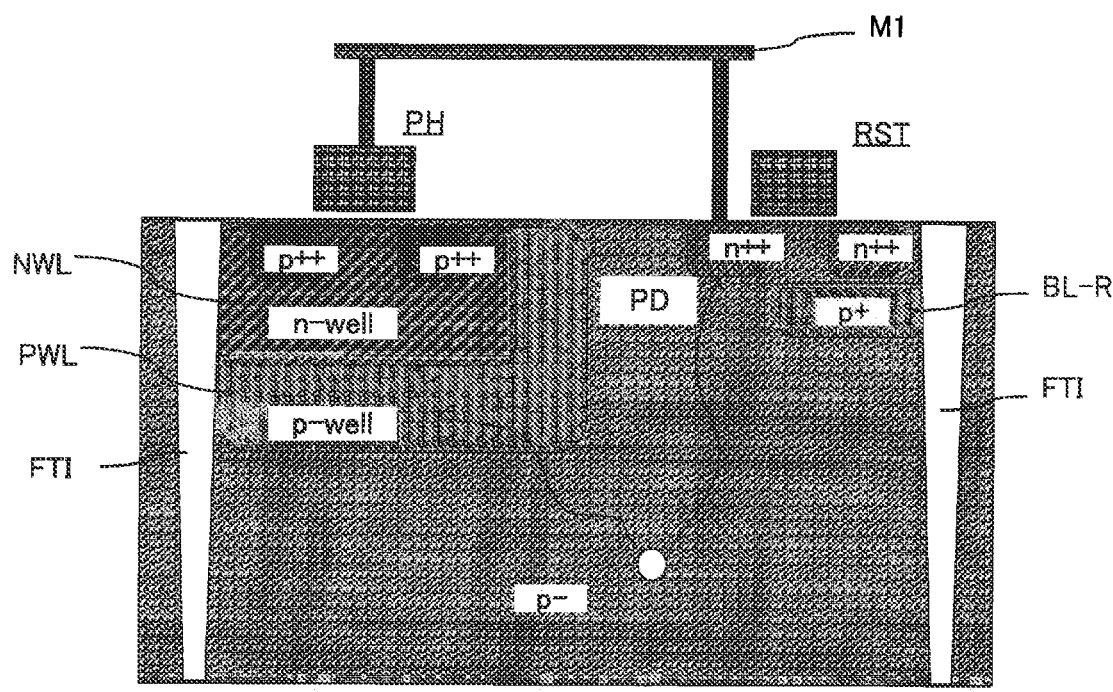
FIG. 2 is a cross-sectional view of a sensor substrate that is a part of a pixel in FIG. 1.

FIG. 1 is a diagram illustrating a premise configuration as a premise of an embodiment, and FIG. 2 is a cross-sectional view of a sensor substrate that is a part of a pixel of the premise configuration.

A photodiode PD accumulates charges (electrons in this case) based on incident light. A cathode of the photodiode PD serves as an output end, and an anode is connected to a power supply (e.g., ground). Therefore, an output voltage Vpd of the photodiode PD is an output signal.

The photodiode PD operates in a logarithmic region (at high illuminance) where the photodiode PD operates with a forward bias, and a linear region (at low illuminance) where the photodiode PD operates with a reverse bias and a part of the forward bias. An operation mode in the logarithmic region is called a photovoltaic mode, and an operation mode in the linear region is called a linear mode.

One end (drain) of a reset transistor RST is connected to the output end of the photodiode PD, and the other end (source) of the reset transistor RST is connected to a power supply (e.g., ground) through a reset power supply B. In this example, the reset transistor RST is an n-channel transistor.

The cathode of the photodiode PD is connected to a gate of a peak hold transistor PH. The peak hold transistor PH is a p-channel transistor. A source of the peak hold transistor PH is connected to an injection power supply injection. A peak hold circuit includes the peak hold transistor PH, a holding capacitor Csig, and a switch transistor SWsig.

A source of the switch transistor SWsig is connected to a drain of the peak hold transistor PH. One end of the holding capacitor Csig is connected to a drain of the switch transistor SWsig. The other end of the holding capacitor Csig is connected to a power supply (e.g., ground). The switch transistor SWsig is a p-channel transistor.

The drain of the switch transistor SWsig is connected to a gate of a readout source follower transistor SF. A drain of the readout source follower transistor SF is connected to a power supply, and a source is connected to a drain of a selection transistor SEL. A source of the selection transistor SEL is connected to an output line 40.

A row selection signal is supplied to a gate of the selection transistor SEL. When the row selection signal becomes an H level, a signal corresponding to a gate voltage of the readout source follower transistor SF is output to the output line 40.

After the reset transistor RST is turned on to reset the photodiode PD, the injection power supply injection becomes an H level for a short period while the switch transistor SWsig is on, to inject charges (holes) to the holding capacitor Csig through the peak hold transistor PH and to discharge excess charges. As a result, the holding capacitor Csig is put into a reset state.

In another state, a signal supplied from the peak hold transistor PH is accumulated in the holding capacitor Csig through the switch transistor SWsig during one frame period. As described above, the output voltage corresponding to the accumulated charges of the photodiode PD is supplied to the gate of the peak hold transistor PH. Therefore, charges corresponding to the incident light amount of the photodiode PD during one frame period are accumulated in the holding capacitor Csig.

Further, when the switch transistor SWsig is turned off and the selection transistor SEL is turned on, a voltage signal corresponding to the charges accumulated in the holding capacitor Csig is read out to the output line 40.

Note that, in the present embodiment, a MOSFET is used as the transistor.

As described above, in the present embodiment, the peak hold circuit that includes the peak hold transistor PH, the switch transistor SWsig, and the holding capacitor Csig is included in the pixel. Further, the readout source follower transistor SF reading out the signal to outside of the pixel and the selection transistor SEL are also necessary in the pixel.

When the photodiode PD operates in the logarithmic region, the photodiode PD has logarithmic characteristics; however, the signal having linear characteristics is leaked to the holding capacitor Csig.

Therefore, in the present embodiment, the photodiode PD, the reset transistor RST, and the peak hold transistor PH are provided on a sensor substrate SB1, as shown in FIG. 1, and the switch transistor SWsig, the holding capacitor Csig, the readout source follower transistor SF, and the selection transistor SEL are provided on a circuit substrate SB2 different from the sensor substrate SB1.

Further, a sensor substrate-side line from the drain of the peak hold transistor PH on the sensor substrate SB1 and a circuit substrate-side line from the source of the switch transistor SWsig on the circuit substrate SB2 are connected by a pixel contact CON provided on both substrates. The pixel contact CON includes a sensor substrate-side contact CON1 and a circuit substrate-side contact CON2 that are connected to each other. In FIG. 2, the output end of the photodiode PD and the gate of the peak hold transistor PH are connected through a metal wire M1.

At this time, when the peak hold transistor PH is provided on the sensor substrate SB1, such a problem that a detection capacity of the photodiode PD is largely increased and sensitivity is largely reduced occurs.

As illustrated in FIG. 2, an n-type region on the output end side of the photodiode PD is shared with the source of the reset transistor RST. To prevent the signal charges (electrons) generated in a p− substrate by the incident light from leaking into the drain of the reset transistor RST, a p+ blocking layer BL-R is provided below the drain of the reset transistor RST.

Since the peak hold transistor PH is a p-channel transistor, the peak hold transistor PH is provided inside n-well NWL. To prevent the signal charges from leaking into the n-well NWL, a p-well layer PWL is provided. Impurity concentration of the p-well layer PWL is desirable to be comparable to that of the p+ blocking layer BL-R. Isolations FTI are provided around the pixel.

As described above, when the n-type photodiode PD and the p-type transistor (peak hold transistor PH) are provided in the sensor substrate SB1 that is the p− substrate, the pixel structure becomes complicated. This makes it difficult to miniaturize a pixel size. Further, there is such a problem that, when the two substrates are coupled, a parasitic capacity Cs of a coupling portion is generated, and noise is increased when the switch transistor SWsig is turned on/off.

On the other hand, to mount the image sensor using the photovoltaic mode on a vehicle, the peak hold circuit is necessary because it is necessary to suppress an LED flicker occurring in the logarithmic region of the image sensor. In other words, in the logarithmic region, the signal corresponding to the incident light amount when the shutter is off is output; however, since the LED is repeatedly turned on and off at a predetermined frequency, a flicker occurs due to mixing of the signal when the LED is on and the signal when the LED is off.

Configuration According to Embodiment

Figure 3:
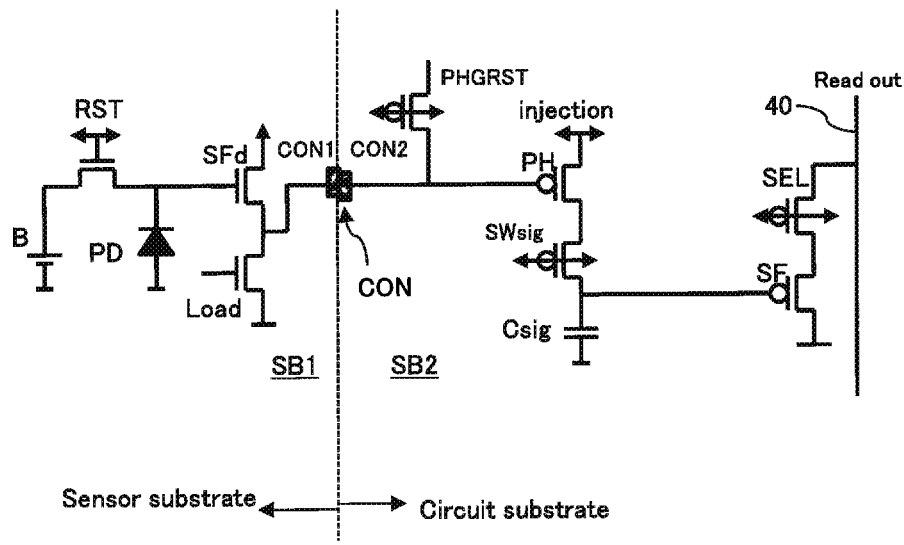
FIG. 3 is a diagram illustrating a circuit configuration according to the embodiment.
Figure 4:
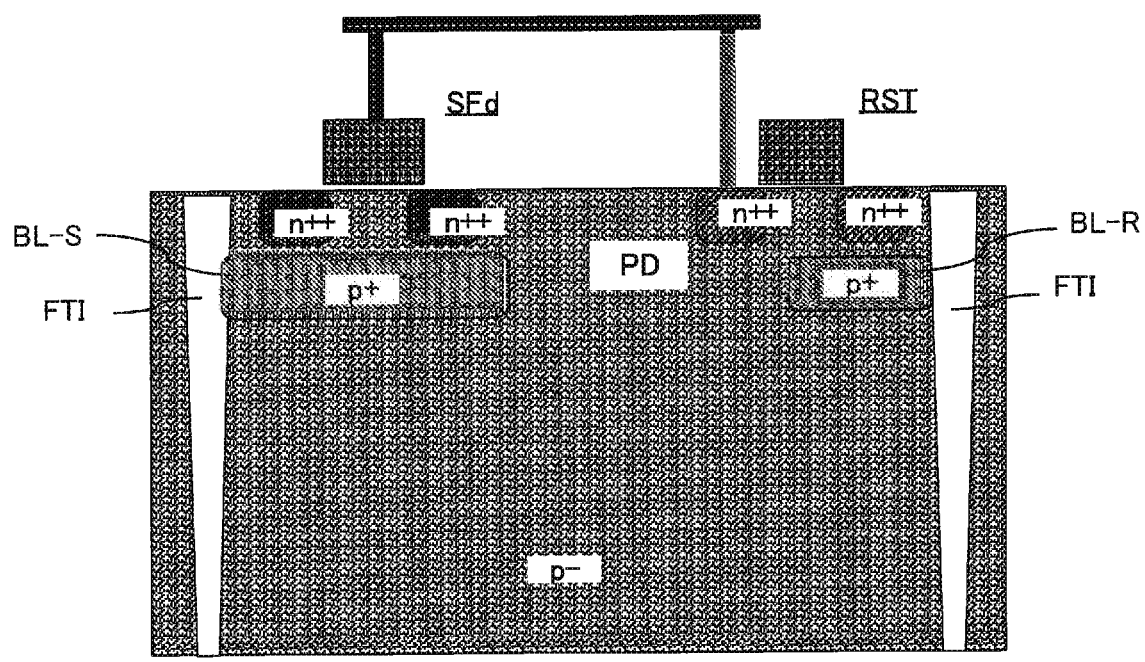
FIG. 4 is a cross-sectional view of a sensor substrate that is a part of a pixel in FIG. 3.

FIG. 3 is a diagram illustrating a circuit configuration according to the embodiment, and FIG. 4 is a cross-sectional view of the sensor substrate.

As illustrated in FIG. 3, in the present embodiment, the peak hold transistor PH is provided not on the sensor substrate SB1 but on the circuit substrate SB2. Further, a pixel source follower transistor SFd and a load transistor Load are provided on the sensor substrate SB1. In other words, the pixel is divided into a sensor substrate-side pixel and a circuit substrate-side pixel, and the peak hold circuit is not included in the sensor substrate-side pixel but included in the circuit substrate-side pixel.

More specifically, the output end of the photodiode PD is connected to a gate of the pixel source follower transistor SFd. A drain of the pixel source follower transistor SFd is connected to a power supply, and a source is connected to a drain of the load transistor Load. A source of the load transistor Load is connected to a power supply such as a ground. When a gate voltage of the load transistor Load is set to a predetermined value, the pixel source follower transistor SFd performs source follower operation, and a signal corresponding to an output of the photodiode PD is supplied to the gate of the peak hold transistor PH.

The reset transistor RST, the pixel source follower transistor SFd, and the load transistor Load provided on the sensor substrate SB1 are all n-channel transistors.

The source of the pixel source follower transistor SFd is connected to the sensor substrate-side contact CON1 of the pixel contact CON. The sensor substrate-side contact CON1 is connected to the circuit substrate-side contact CON2. Further, the circuit substrate-side contact CON2 is connected to the gate of the peak hold transistor PH.

The peak hold transistor PH is provided on the circuit substrate SB2 together with the switch transistor SWsig, the holding capacitor Csig, the readout source follower transistor SF, and the selection transistor SEL. These transistors are all p-channel transistors. Operation of the circuit provided on the circuit substrate SB2 is basically similar to the operation of the circuit in FIG. 1. Since the transistors are the p-channel transistors, polarities of control signals for the transistors other than the peak hold transistor PH are inverted. As described above, the provided transistors are unified to the p-channel, which makes it possible to simplify the structure as with the sensor substrate SB1.

A gate reset transistor PHGRST is provided on the circuit substrate SB2. The gate reset transistor PHGRST resets the gate of the peak hold transistor PH. The gate reset transistor PHGRST is a p-channel transistor, a source is connected to a power supply, and a drain is connected to the gate of the peak hold transistor PH.

In a state where the circuit substrate SB2 is not connected to the sensor substrate SB1, the gate of the peak hold transistor is in an electrically floating state. Therefore, the gate of the peak hold transistor PH may be electrostatically destroyed. When the gate reset transistor PHGRST is connected to the gate of the peak hold transistor PH, the gate reset transistor PHGRST functions as an ESD protective transistor. In this case, the gate reset transistor PHGRST can be used in an off state.

Further, the load transistor Load is provided on the sensor substrate SB1 in this example; however, the load transistor Load can be provided on the circuit substrate SB2. In this example, a p-channel transistor is preferably used as the load transistor Load.

As illustrated in FIG. 4, the photodiode PD is shared with the source of the reset transistor RST. To prevent the signal charges (electrons) generated in a p− substrate by the incident light from leaking into the drain of the reset transistor RST, a p+ blocking layer BL-R is provided below the drain of the reset transistor RST. A p+ blocking layer BL-S that prevents the signal charges from flowing into the source/drain of the pixel source follower transistor SFd is provided below the pixel source follower transistor SFd.

As described above, the pixel structure is simplified as compared with the structure in FIG. 2. This makes it possible to miniaturize the pixel size. Further, a floating capacity of the gate of the switch transistor SWsig can be reduced. Accordingly, noise is not increased when the switch transistor SWsig is turned on/off.

Figure 5:
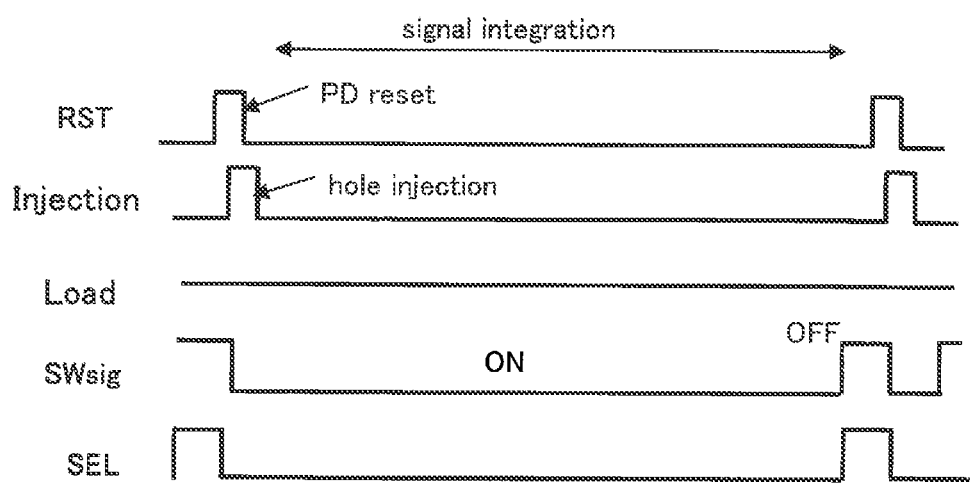
FIG. 5 is a timing chart illustrating operation of the circuit in FIG. 3.

FIG. 5 is a timing chart illustrating operation of the circuit in FIG. 3. The reset transistor RST is turned on to reset the photodiode PD. Next, holes from the injection power supply are injected into the holding capacitor Csig through the peak hold transistor PH while the switch transistor SWsig is on.

In this state, the output of the photodiode PD is accumulated in the holding capacitor Csig through the pixel source follower transistor SFd, the peak hold transistor PH, and the switch transistor SWsig.

After an integration period of one frame elapses, the switch transistor SWsig is turned off to end accumulation of the signal, and the signal is held in the holding capacitor Csig. Further, the selection transistor SEL is turned on to read out the signal accumulated in the holding capacitor Csig from the readout source follower transistor SF to the output line 40.

Noise Reduction

Figure 6:
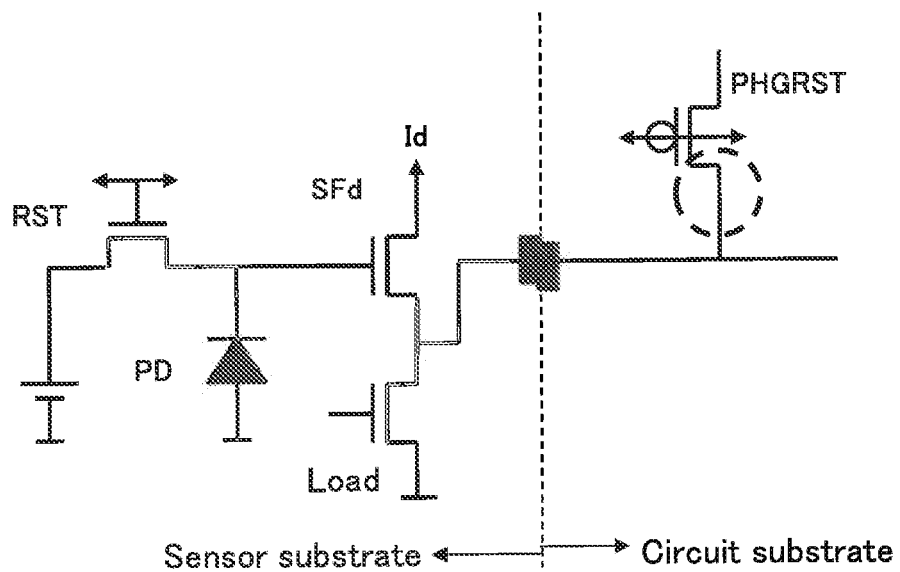
FIG. 6 is a diagram to explain noise occurrence.

As illustrated in FIG. 6, the reset transistor PHGRST is connected to a connection point of the source of the pixel source follower transistor SFd and the drain of the load transistor Load. Accordingly, a dark current generating in the source of the reset transistor PHGRST becomes noise to the signal supplied to the peak hold transistor PH.

The noise by the dark current depends on a current Id flowing through the pixel source follower transistor SFd.

Figure 7:
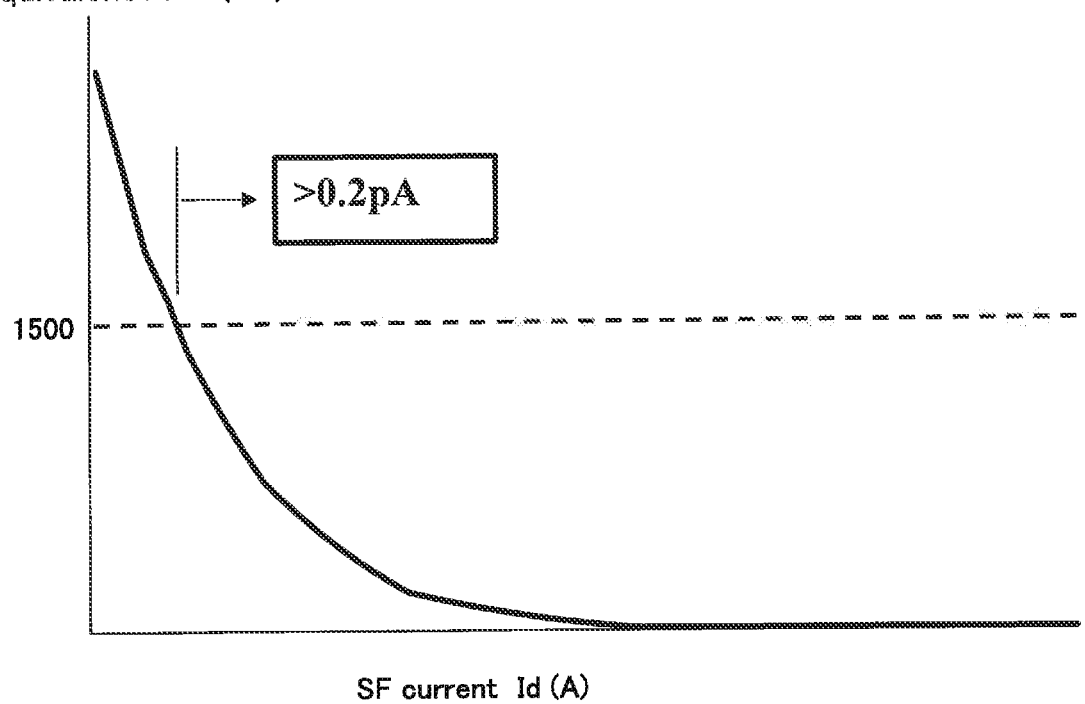
FIG. 7 is a diagram illustrating relationship between a current Id and noise caused by a dark current determined from SPICE simulation.

FIG. 7 is a diagram illustrating relationship between the current Id and the noise by the dark current determined from SPICE simulation. FIG. 7 illustrates calculated noise at the output end of the photodiode PD when fixed pattern noise FPN by the dark current is assumed to be 1500 ele (=electron)/s (=sec). Target equivalent noise Ideq is 1 ele/s.

As illustrated in the drawing, to reduce the equivalent noise Ideq to 1 ele/s or less, the current Id of the pixel source follower transistor SFd is set to 0.2 pA or more.

When a gain of the pixel source follower transistor SFd is assumed to be 1, $Ideq=Idrk^2/Id$ (Id: drain current of pixel source follower transistor SFd) is approximately established.

At this time, when Idrk=1500 ele*q/s (q: number of elementary charges) and Ideq=1 ele*q/s (noise 1 ele/s by target dark current) are assumed, Id=0.225 pA is obtained.

The value is substantially coincident with a simulation result described above.

As described above, when the drain current Id of the pixel source follower transistor SFd is set to 0.2 pA or more, the noise by the above-described dark current in the drain of the pixel source follower transistor SFd can be reduced to 1 electron/see or less, and S/N can be increased.

Note that increase in thermal noise by positive feedback of the pixel source follower transistor SFd has been separately studied. In the study, when pixel source follower transistor SFd performs operation in a state where the number of carrier charges (electrons) on a channel of the pixel source follower transistor SFd is one or zero, increase in thermal noise by the positive feedback is eliminated. In a case of a transistor having a gate length of about 0.1 µm to about 0.01 µm, the current is about 1 nA.

Current of Pixel Source Follower Transistor

Causing the above-described direct current Id to flow through the pixel source follower transistor SFd makes it possible to improve S/N. However, flow of the direct current increases power consumption.

Figure 8:
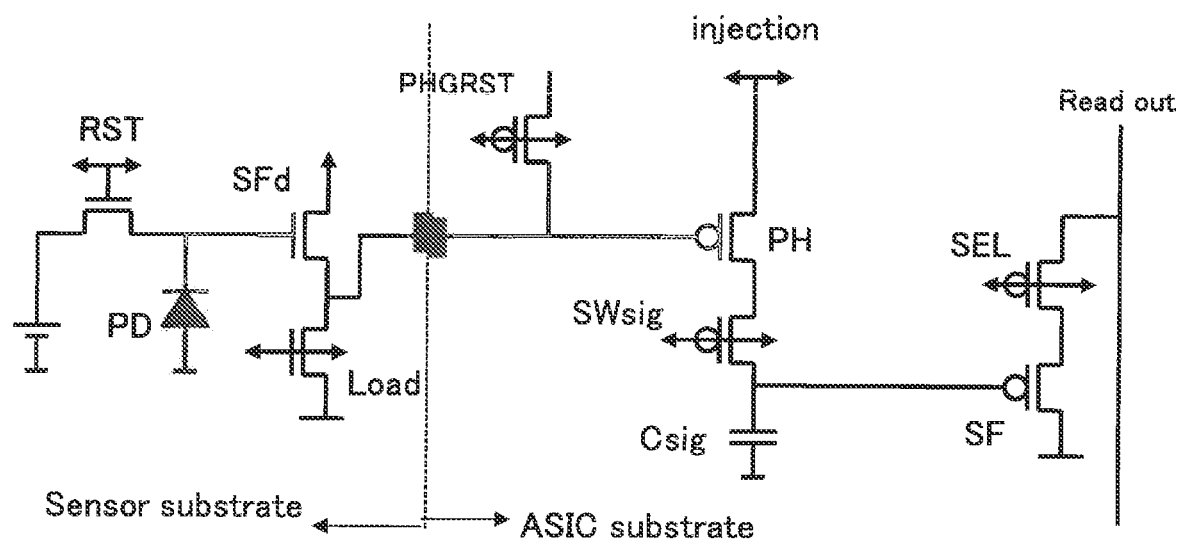
FIG. 8 is a diagram illustrating a configuration in which a gate of a load transistor Load is pulse-driven.

In a configuration illustrated in FIG. 8, the power consumption is reduced by pulsing the current flowing through the pixel source follower transistor SFd. In other words, the gate of the load transistor Load is pulse-driven to limit a period during which the above-described direct current flows through the load transistor Load.

Figure 9:
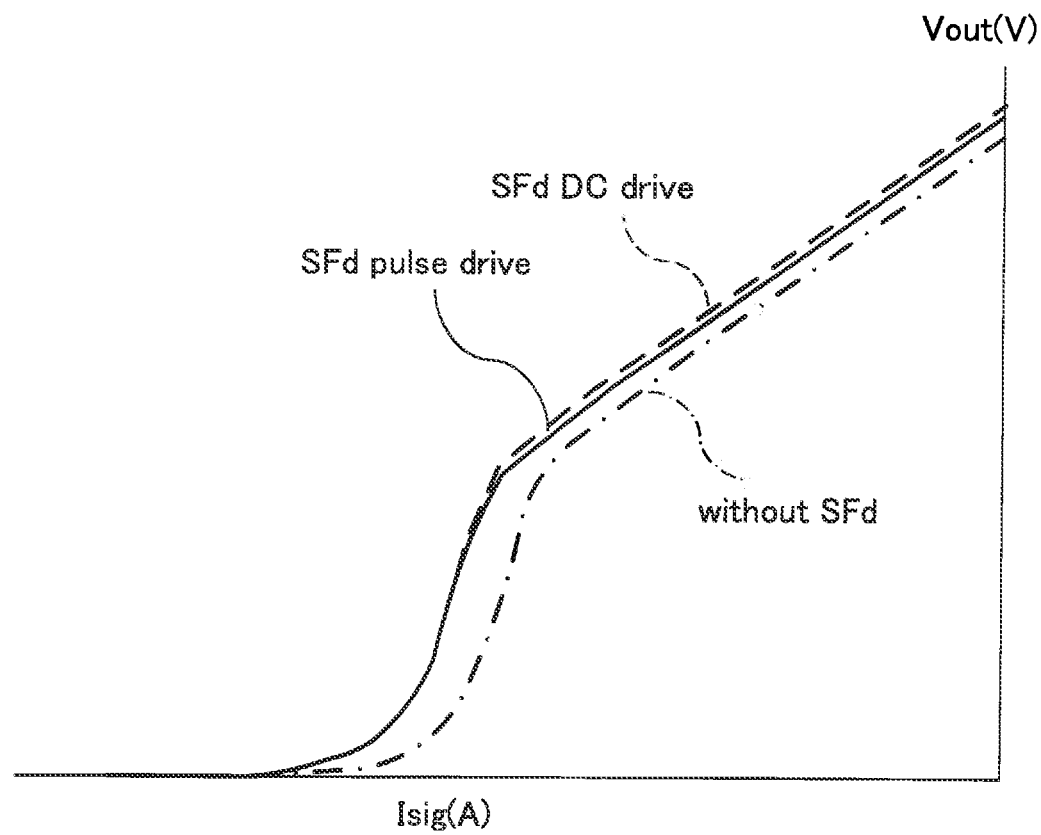
FIG. 9 is a diagram illustrating input/output characteristics of a pixel source follower transistor SFd.

FIG. 9 is a diagram illustrating input/output characteristics of the pixel source follower transistor SFd. As illustrated, almost no difference exists between an output in a case where the pixel source follower transistor SFd is DC-driven and an output in a case where the pixel source follower transistor SFd is pulse-driven. Accordingly, performing pulse driving makes it possible to reduce the power consumption almost without influencing on the operation.

The SPICE simulation when the pixel source follower transistor SFd was pulse-driven was performed. A period of the pulse driving of the load transistor Load was set to 100 µs, and an on period was set to 5.1 µs. In a case where the incident light is weak, the output voltage of the photodiode PD substantially linearly changes within the integration period in the linear region. When the incident light becomes strong, change of the output voltage stops in the middle, and the operation is changed to the operation in the logarithmic region. In the output of the pixel source follower transistor SFd, variation by the pulse driving occurs, whereas in the output of the peak hold circuit, a jumping waveform (mixed wave) of the pulse disappears. This is because the peak hold circuit functions as a low-pass filter.

Configuration of Image Sensor

Figure 10:
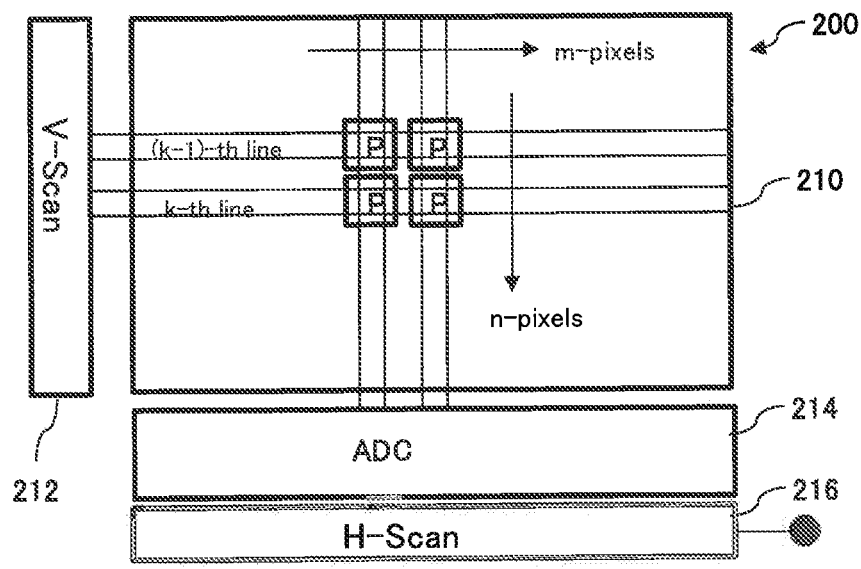
FIG. 10 is a diagram illustrating an image sensor 200 in which the pixels according to the embodiment are two-dimensionally arranged.

FIG. 10 is a diagram illustrating an image sensor 200 in which the pixels according to the embodiment are two-dimensionally arranged. In this example, a pixel circuit of a pixel array 210 is disposed on both of the sensor substrate SB1 and the circuit substrate SB2, a vertical scan circuit 212 and a horizontal scan circuit 216 are disposed only on the circuit substrate SB2, and an analog-to-digital converter ADC 214 may be disposed on either one or both of the sensor substrate SB1 and the circuit substrate SB2.

The pixel array 210 includes pixels P as described above arranged in m columns*n rows (m*n), namely, includes m pixels in a horizontal direction and n pixels in a vertical direction. The vertical scan circuit V-Scan sequentially selects rows of the pixels in the vertical direction. The pixels in each column are connected to the analog-to-digital converter ADC by a readout line in the vertical direction. The horizontal scan circuit H-Scan is connected to the analog-to-digital converter ADC, and image signals of the respective pixels are sequentially output from the horizontal scan circuit H-Scan.

Figure 11:
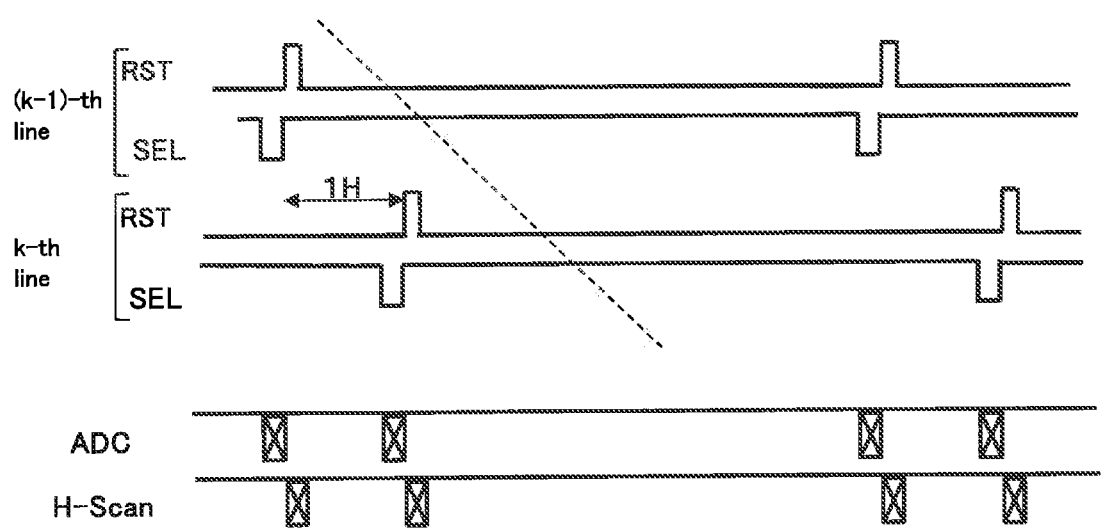
FIG. 11 is a timing chart illustrating operation of the image sensor in FIG. 10.

FIG. 11 is a timing chart illustrating operation of the image sensor in FIG. 10. Pixel driving pulses only for the reset transistor RST and the selection transistor SEL are illustrated. In FIG. 11, pulses of hole injection and transistor SWsig in FIG. 5 are omitted.

In a (k−1)-th row, the reset transistor RST is turned on to reset the photodiode PD. The reset is performed for each vertical period (=1 frame period). Further, exposure starts after one reset. In addition, the signal is read out shortly before next reset. As described above, the selection transistor SEL is turned on, and the signal accumulated in the holding capacitor Csig is read out to the output line 40. The control is performed in response to a signal from the vertical scan circuit 212. The readout signal is an analog signal, and the analog signal is supplied to the analog-to-digital converter (ADC) 214 and is converted into a digital signal. The operation is simultaneously performed on the m pixels in one horizontal line. Thereafter, the horizontal scan circuit (H-scan) 216 sequentially outputs the digital signals of the m pixels.

Next, the same operation is performed on a k-th row by shifting the horizontal period by 1H. Signals of all of the m*n pixels can be read out by repeating the operation n times.

Modification 1

Figure 12:
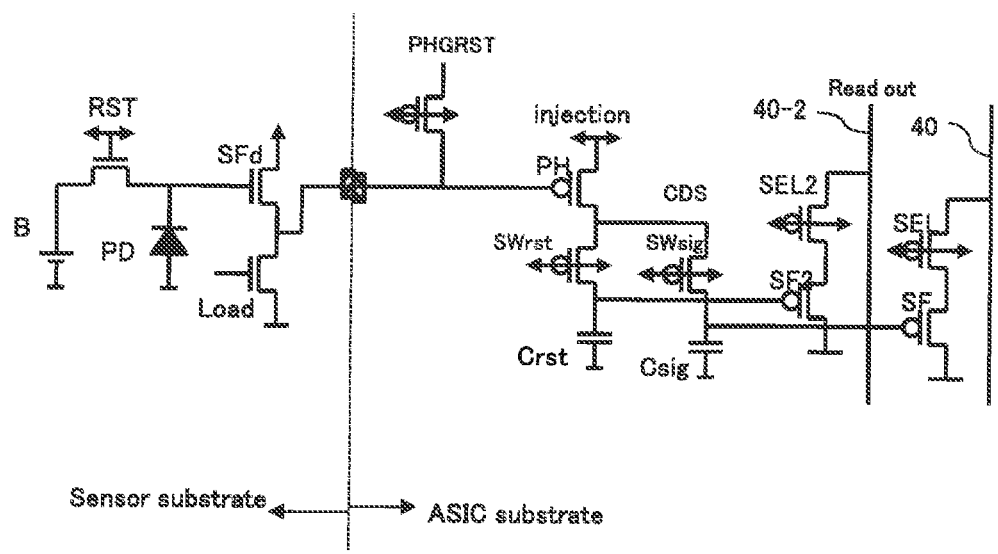
FIG. 12 is a diagram illustrating a circuit configuration according to a modification 1.

FIG. 12 is a diagram illustrating a circuit configuration according to a modification 1. In this example, the source of the switch transistor SWsig and a source of a switch transistor SWrst are connected in parallel to the drain of the peak hold transistor PH. A drain of the switch transistor SWrst is connected to a predetermined power supply through a holding capacitor Crst. A connection point of the switch transistor SWrst and the holding capacitor Crst is connected to a gate of a source follower transistor SF2, and a source of the source follower transistor SF2 is connected to an output line 40-2 through a selection transistor SEL2.

Accordingly, the output of the peak hold transistor PH can be held in the holding capacitor Csig and output, and can held in the holding capacitor Crst and output.

Figure 13:
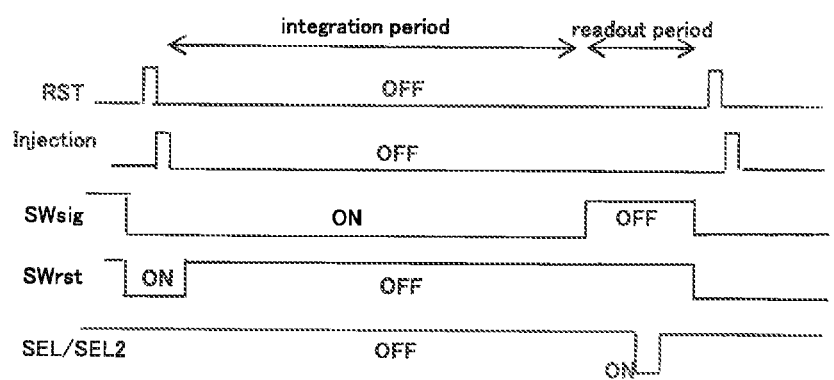
FIG. 13 is a timing chart of the circuit in FIG. 12.

FIG. 13 is a timing chart of the circuit in FIG. 12. In a state where the switch transistors SWsig and SWrst are turned on, the reset transistor RST and the injection power supply are sequentially turned on for a short period, to reset the photodiode PD 10 and to inject holes into the capacitors Csig and Crst. Thereafter, the switch transistor SWrst is turned off to cause the holding capacitor Crst to hold noise at the reset. After the integration period ends, the switch transistor SWsig is turned off to cause the holding capacitor Csig to hold the signal.

Thereafter, the row selection transistors SEL2 and SEL are turned on to output the noise and the signal held in the holding capacitors Crst and Csig to the output lines 40 and 40-2, respectively. The output of the signal is sequentially performed row by row during a readout period after the integration period.

The signal and the noise read out to the two output lines 40 and 40-2 are calculated in an external circuit, and the noise is removed by subtraction.

Modification 2

Figure 14:
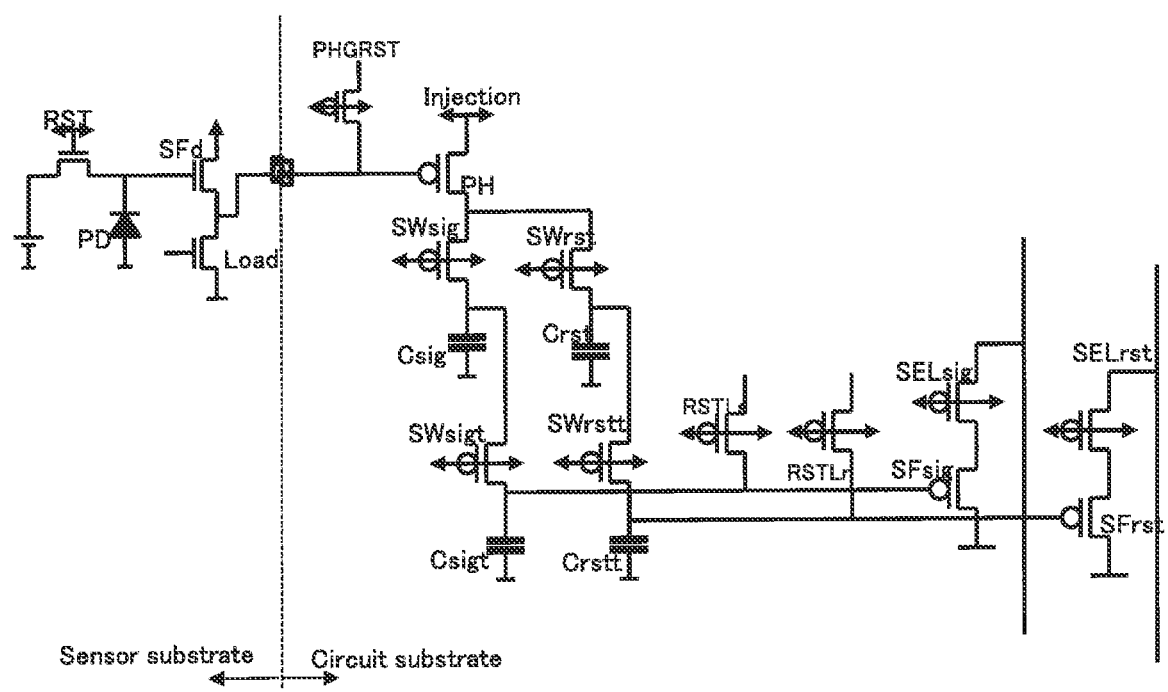
FIG. 14 is a diagram illustrating a configuration of a pixel circuit enabling the circuit in FIG. 12 as a base to perform global integration operation.

FIG. 14 is a diagram illustrating a configuration of a pixel circuit enabling the circuit in FIG. 12 as a base to perform global integration operation.

As illustrated, as compared with the circuit in FIG. 12, switch transistors SWsigt and SWrstt, capacitors Csigt and Crstt, and reset transistors RSTLs and RSTLr are added.

As a result, the signal and the noise held in the holding capacitors Csig and Crst can be transferred to the capacitors Csigt and Crstt, and then output. Accordingly, all the pixels can hold the noise and the signals and output by each line at the same timing.

Figure 15:
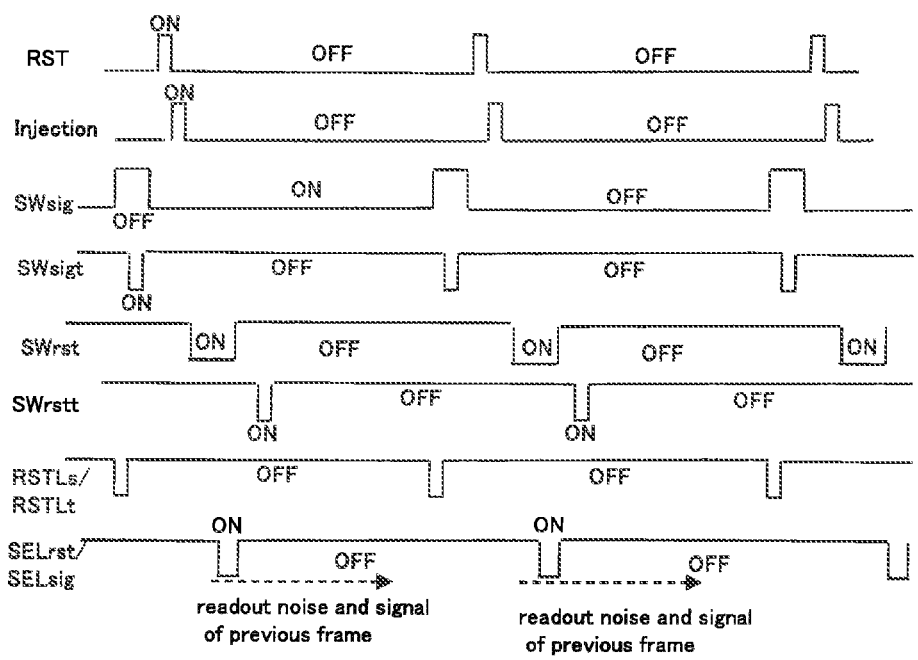
FIG. 15 is a timing chart illustrating operation of the circuit in FIG. 14.

FIG. 15 is a timing chart illustrating operation of the circuit in FIG. 14. The photodiode PD is reset, and holes are injected into the holding capacitors Crst and Csig by the injection power supply. After the noise, immediately after the reset, is held in the holding capacitor Crst, the held noise is transferred to the capacitor Crstt. In addition, the signal is accumulated in the holding capacitor Csig, and after the signal integration period ends, the accumulated signal is transferred to the capacitor Csigt.

Thereafter, in a next frame, row selection transistors SELrst and SELsig are sequentially turned on, and the signals and the noise accumulated in the capacitors Csigt and Crstt of the pixels are sequentially output in the row direction.

What is claimed is:

1. An image sensor, comprising:
a sensor substrate; and
a circuit substrate, wherein
the sensor substrate includes a plurality of sensor substrate-side pixels,
each of the sensor substrate-side pixels includes a photodiode configured to operate in a photovoltaic mode, a reset transistor configured to reset the photodiode, and a pixel source follower transistor connected to an output of the photodiode,
the circuit substrate includes circuit substrate-side pixels corresponding to the respective sensor substrate-side pixels of the sensor substrate,
each of the circuit substrate-side pixels includes a peak hold circuit configured to hold a peak of an output of the pixel source follower transistor by receiving the output of the pixel source follower transistor, and a readout source follower transistor configured to read out a voltage held in a holding capacitor,
the peak hold circuit includes a peak hold transistor configured to allow a current corresponding to the output of the pixel source follower transistor to flow therethrough, a switch transistor configured to turn on/off an output of the peak hold transistor, and the holding capacitor configured to hold an output of the switch transistor, and
the sensor substrate-side pixels and the respective corresponding circuit substrate-side pixels are connected to each other.

2. The image sensor according to claim 1, wherein a line on a side of the sensor substrate from a source of the pixel source follower transistor is connected to a gate of the peak hold transistor on a side of the circuit substrate through a pixel contact.

3. The image sensor according to claim 2, wherein a protective transistor is connected to a line connecting the pixel contact on the circuit substrate and a gate of the peak hold transistor.

4. The image sensor according to claim 1, wherein
the pixel source follower transistor performs source follower operation in a state where number of carrier charges on a channel of the pixel source follower transistor is one or zero, and
a current in the source follower operation is greater than $Idrk^2/Ideq$, where Idrk is a dark current in the pixel source follower transistor, and Ideq is an equivalent dark current converted at an output end of a photodiode.

5. The image sensor according to claim 1, further comprising:
a vertical scan circuit configured to drive the sensor substrate-side pixels on the sensor substrate and the circuit substrate-side pixels on the circuit substrate;
an analog-to-digital converter configured to convert an analog signal output from each of the sensor substrate-side pixels into a digital signal; and
a horizontal scan circuit configured to serially output the digital signals obtained by the analog-to-digital converter.

6. The image sensor according to claim 1, further comprising:
a vertical scan circuit configured to drive the sensor substrate-side pixels on the sensor substrate and the circuit substrate-side pixels on the circuit substrate;
an analog-to-digital converter configured to convert an analog signal output from each of the circuit substrate-side pixels into a digital signal; and
a horizontal scan circuit configured to serially output the digital signals obtained by the analog-to-digital converter.

7. The image sensor according to claim 1, wherein
the sensor substrate-side pixels are arranged in a matrix on the sensor substrate,
the circuit substrate-side pixels are arranged in a matrix on the circuit substrate, and
outputs of the readout source follower transistors of the circuit substrate-side pixels in each column are connected to one output line extending in a vertical direction.

* * * * *